United States Patent
Sakamoto et al.

(10) Patent No.: US 8,328,937 B2
(45) Date of Patent: Dec. 11, 2012

(54) SEED CRYSTAL AXIS FOR SOLUTION GROWTH OF SINGLE CRYSTAL

(75) Inventors: Hidemitsu Sakamoto, Susono (JP); Yasuyuki Fujiwara, Shizuoka (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 0 days.

(21) Appl. No.: 12/673,011

(22) PCT Filed: Jul. 21, 2009

(86) PCT No.: PCT/JP2009/063316
§ 371 (c)(1),
(2), (4) Date: Feb. 11, 2010

(87) PCT Pub. No.: WO2011/010394
PCT Pub. Date: Jan. 27, 2011

(65) Prior Publication Data
US 2012/0103251 A1    May 3, 2012

(51) Int. Cl.
*C30B 11/14*    (2006.01)
(52) U.S. Cl. ............ 117/206; 117/3; 117/10; 117/11; 117/13; 117/35; 117/54; 117/73; 117/84; 117/88; 117/200; 117/204; 117/208; 117/217
(58) Field of Classification Search .......... 117/3, 10–11, 117/13, 35, 54, 73, 84, 88, 200, 204, 206, 117/208, 217, 911, 931–932, 934–935, 951
See application file for complete search history.

(56) References Cited

U.S. PATENT DOCUMENTS 6,136,094 A * 10/2000 Yamaji et al. ............... 117/200
6,863,728 B2 * 3/2005 Vodakov et al. ............. 117/202
2002/0083892 A1 * 7/2002 Kondo et al. ................ 117/109
2009/0084309 A1 * 4/2009 Sakamoto .................... 117/73

FOREIGN PATENT DOCUMENTS

| JP | 62-216995 | | 9/1987 |
|---|---|---|---|
| JP | 62216995 A | * | 9/1987 |
| JP | 63-295494 | | 12/1988 |
| JP | 9-315883 | | 12/1997 |
| JP | 10-24362 | | 1/1998 |
| JP | 10024362 A | * | 1/1998 |
| JP | 11-278984 | | 10/1999 |
| JP | 2004-269297 | | 9/2004 |
| JP | 2004-338971 | | 12/2004 |

(Continued)

*Primary Examiner* — Michael Kornakov
*Assistant Examiner* — Kenneth A Bratland, Jr.
(74) *Attorney, Agent, or Firm* — Finnegan, Henderson, Farabow, Garrett & Dunner, LLP

(57) ABSTRACT

A seed crystal axis used in a solution growth of single crystal production system is provided to prevent formation of polycrystals and grow a single crystal with a high growth rate. The seed crystal axis includes a seed crystal bonded to a seed crystal support member between which is interposed a laminated carbon sheet having a high thermal conductivity in a direction perpendicular to a solution surface of a solvent. The laminated carbon sheet includes a plurality of carbon thin films laminated with an adhesive or a plurality of pieces with differing lamination directions arranged in a lattice. Alternatively, a wound carbon sheet including a carbon strip wound concentrically from the center or a wound carbon sheet including a plurality of carbon strips with differing thicknesses which are wound and laminated from the center may be provided.

17 Claims, 11 Drawing Sheets

FOREIGN PATENT DOCUMENTS

| | | |
|---|---|---|
| JP | 2006-62936 | 3/2006 |
| JP | 2007-305700 | 11/2007 |
| JP | 2008-247725 | 10/2008 |
| JP | 2009-43851 | 2/2009 |
| JP | 2009-55021 | 3/2009 |
| JP | 2009-126770 | 6/2009 |
| WO | WO00/39372 | 7/2000 |
| WO | WO 2007094155 A1 * | 8/2007 |
| WO | WO 2009/069564 A1 | 6/2009 |

* cited by examiner

Fig.2 PRIOR ART
REMAINDER IS GROWN CRYSTAL
SURFACE PROPERTIES UNEVEN
AND GROWTH AMOUNT DIFFERENT
5mm
SEED CRYSTAL SIZE
Fig.3
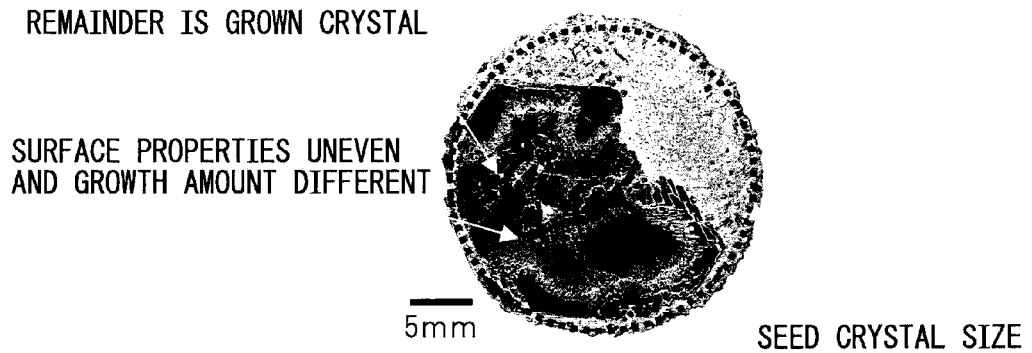
HIGH THERMAL
CONDUCTION DIRECTION
5mm
Fig.4
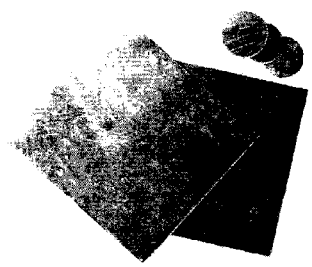

SEED CRYSTAL AXIS FOR SOLUTION GROWTH OF SINGLE CRYSTAL

CROSS-REFERENCE TO RELATED APPLICATIONS

This application is a national phase application of International Application No. PCT/JP2009/063316, filed Jul. 21, 2009, the contents of which are incorporated herein by reference.

TECHNICAL FIELD

The present invention relates to a crystal axis for solution growth of single crystal, more specifically relates to a crystal axis for solution growth of single crystal able to prevent or suppress polycrystallization and increase the growth rate.

BACKGROUND ART

SiC single crystals are thermally and chemically extremely stable, are superior in mechanical strength, are resistant to radiation, in addition, have superior properties such as high breakdown voltage and high thermal conductivity in comparison to Si (silicon) single crystals, enable easy p- and n-conductivity electronic control by adding impurities, and have wide forbidden bandwidths (approximately 3.3 eV for 4H-type single crystal SiC, approximately 3.0 eV for 6H type single crystal SiC). Therefore, realization of high temperature, high frequency, voltage resistance/environment resistance which could not be realized with Si single crystals, GaAs (gallium arsenide) single crystals, and other existing semiconductor materials is possible. Expectations of these as next generation semiconductor materials are rising.

Conventionally, the gas phase technique and the liquid phase technique are known as typical growth methods of SiC single crystals. As the gas phase technique, normally the sublimation technique is used. The sublimation technique comprises arranging SiC material powder and an SiC single crystal seed crystal facing each other in a graphite crucible and heating the crucible in an inert gas atmosphere to epitaxially grow the single crystal. However, it is known that with this gas phase technique, the polycrystals growing from the crucible inner walls negatively affect the quality of the SiC single crystal.

Further, the liquid phase technique comprises using an SiC single crystal production system which has a basic structure comprised of a crucible for holding a solvent, for example, a graphite crucible, a solvent, a high frequency coil or other external heating system, an insulator material, a seed crystal support member that can be lowered and raised (for example, a graphite holder), and a seed crystal attached at the tip of the seed crystal support member, dissolving a C (carbon) from a C supply source, for example, the graphite crucible, into an Si melt, an Si alloy melt in which metal had been dissolved, or another Si-containing melt in the crucible to obtain a solvent, and growing an SiC single crystal layer on the SiC seed crystal through solution precipitation.

In such a method of growing SiC single crystals by the liquid phase technique, use is made of either the SiC single crystal growth method of the method of growth by providing a temperature gradient to the solvent so that the solution temperature around the seed crystal becomes lower than the solution temperature at other parts or the method of growth by slowly cooling the entire solvent, however, it is known that neither are able to avoid formation of crystals other than the single crystal due to the temperature distribution and concentration distribution in the solution at the time of cooling the solvent.

Therefore, a single crystal production system that is able to prevent or suppress formation of crystals other than the single crystal is in demand.

For example, International Patent Publication 2000-39372 describes a growth method and growth system of an SiC single crystal using a gas phase technique provided with a holding material for holding a seed crystal in an SiC seed crystal holding means comprised of a member which protrudes from the container wall surface to the growth container interior and has a higher heat radiating property than the container wall surface of the growth container. Further, the publication also describes, as a holding material with a high heat radiating property, pyrographite carbon (carbon material, thermal conductivity of high thermal conductivity direction: 120 kcal/mhr° C.) which can be used in a graphite crucible lid with anisotropic thermal conductivity.

Further, Japanese Patent Publication (A) No. 2006-62936 describes as prior art an SiC single crystal production system using a gas phase technique able to prevent seed crystal breakage and detachment by interposing a plastic deformable carbon sheet between a seed crystal carrier and seed crystal to absorb the thermal stress generated at the interface.

Further, with respect to the heat conducting anisotropic material, Japanese Patent Publication (A) No. 10-24362 describes a tip of a soldering iron comprising a flexible sheet of a carbon-based material wrapped around the outer peripheral surface of a core to form a laminated body. Further, the publication describes as a specific example of a flexible sheet of a carbon-based material, a graphite sheet having anisotropic thermal conductivity.

Further, Japanese Patent Publication (A) No. 2007-305700 describes a heating member suitable for use in heating an electronic device comprising a sheet member a having a thermal conductivity in the thickness direction higher than a thermal conductivity in the in-plane direction and a sheet member b having a thermal conductivity in the in-plane direction higher than a thermal conductivity in the thickness direction laminated so that the sheet member a is positioned at the side close to the heat radiating part.

Further, Japanese Patent Publication (A) No. 2009-55021 describes a thermally conductive sheet comprising a plurality of thermally conductive sheets having a graphite phase containing anisotropic graphite particles that are laminated to each other by bonding, then cut in the direction perpendicular to the lamination direction and able to be used as a heat radiating member of an electronic device.

Further, Japanese Patent Publication (A) No. 2009-4385 describes a semiconductor package in which an anisotropic thermally conductive graphite sheet is arranged at the heat radiating region of a semiconductor element.

However, even if applying the arts described in these known documents in a solution growth of single crystal production system, it is not possible to achieve crystal growth with no problems in preventing or suppressing formation of crystals other than the single crystals so as to grow the single crystal with a high growth rate.

That is, there are several problems interfering with single crystal growth in the area around the seed crystal when bringing the seed crystal in contact with a high temperature solution, for example, a solvent heated to a high temperature exceeding 1600° C., for example, around 2000° C., and during growth to make the seed crystals grow with a high growth rate. For example, at the bonding surface of the seed crystal and graphite tip at the time of contact with the most initial solution for beginning crystal growth, cracking of the seed crystal and peeling from the graphite axis occur impeding the growth process. Even in the event that the seed crystal does not detach, the majority of the bonding surface of the seed crystal will peel off making it difficult to obtain normally grown crystal.

Further, during growth, the solvent is agitated by stirring etc., so the portion of the graphite axis which the seed crystal is bonded to becomes wetted by the solution at time of contact with the solution and during growth. The carbon from that portion reacts with the solution causing SiC nucleation. The SiC crystals nucleated at the axis surface, that is, polycrystals, gradually increase to the point of hindering the original object, that is, single crystal growth from the seed crystal, thus posing a large problem to single crystal growth of the liquid phase technique.

Further, Japanese Patent Publication (A) No. 2004-269297 describes a gas phase method-based SiC single crystal production system where a flexible carbon sheet is interposed between a seed crystal and a base for holding the seed crystal to ease the stress due to the difference in thermal expansion between the seed crystal and the base, and Japanese Patent Publication (A) No 2004-338971 describes, for an SiC single crystal growth method and growth system thereof, a gas phase method-based SiC seed crystal production system having a buffer member comprised of a carbon sheet arranged between an SiC seed crystal and a seed crystal support member for supporting the seed crystal and thereby able to mitigate the difference in the thermal expansion between the seed crystal and the seed crystal support member. Further, the publication describes, as a specific example of a carbon sheet, one of about 25% of the thermal conductivity of the SiC seed crystal.

Application of such a carbon sheet to a solution method-based SiC single crystal production system may also be considered. However, with a carbon sheet, normally the sheet surface is arranged parallel to the bonding surface, so the thermal conductivity in the direction perpendicular to the solution surface of the solvent (that is, the graphite axis direction) is low and negatively affects the growth rate. Further, if using a thermally conductive anisotropic material (solid carbon), breakage, peeling, or detachment of the seed crystal is liable to occur due to the difference in the thermal expansions between the seed crystal and the thermally conductive anisotropic material.

CITATION LIST

Patent Literature

PLT 1: International Patent Publication 2000-39372
PLT 2: Japanese Patent Publication (A) No. 2006-62936
PLT 3: Japanese Patent Publication (A) No. 10-24362
PLT 4: Japanese Patent Publication (A) No. 2007-305700
PLT 5: Japanese Patent Publication (A) No. 2009-55021
PLT 6: Japanese Patent Publication (A) No. 2009-43851
PLT 7: Japanese Patent Publication (A) No. 2004-269297
PLT 8: Japanese Patent Publication (A) No. 2004-338971
PLT 9: Japanese Patent Publication (A) No. 2008-247725

Thus, in the conventional solution method-based SiC single crystal growth method, contact between the graphite axis and the material axis at the seed crystal vicinity cannot be avoided, so the carbon of the portion of the graphite making contact with the solution reacts with the solution causing SiC nucleation. The SiC crystal nucleated at the graphite axis surface (hereinafter, called "polycrystal") gradually increases to the point of hindering single crystal growth from the seed crystal.

SUMMARY OF INVENTION

Technical Problem

The inventors studied solution growth of single crystal methods and as a result discovered that efficient removal of heat from the seed crystal of the seed crystal axis for single crystal growth to a seed crystal support member is critical. They engaged in further study and as a result completed the present invention.

Therefore, an object of the present invention is to provide a seed crystal axis for solution growth of single crystal able to prevent or suppress formation of polycrystals due to the liquid phase technique and grow a single crystal with a high growth rate.

Solution to Problem

The aspect of the invention of claim of the present application (hereinafter, referred to as "the first aspect of the invention") is a seed crystal axis used in a solution growth of single crystal production system, said seed crystal axis for solution growth of single crystal comprising a seed crystal bonded to a seed crystal support member between which is interposed a laminated carbon sheet having a high thermal conductivity in a direction perpendicular to a solution surface of a solvent and comprising a plurality of carbon thin films laminated with an adhesive.

Further, the aspect of the invention of claim 2 of the present application (hereinafter, referred to as "the second aspect of the invention") is a seed crystal axis used in a solution growth of single crystal production system, said seed crystal axis for solution growth of single crystal comprising a seed crystal bonded to a seed crystal support member between which is interposed a laminated carbon sheet having a high thermal conductivity in a direction perpendicular to a solution surface of a solvent and comprising a plurality of pieces of carbon thin films laminated with adhesive with differing lamination directions arranged in a lattice.

Further, the aspect of the invention of claim 3 of the present application (hereinafter, referred to as the "third aspect of the invention") is a seed crystal axis used in a solution growth of single crystal production system, said seed crystal axis for solution growth of single crystal comprising a seed crystal bonded to a seed crystal support member between which is interposed a wound carbon sheet having a high thermal conductivity in a direction perpendicular to a solution surface of a solvent and comprising a carbon strip wound concentrically from the center.

Further, the aspect of the invention of claim 4 of the present application (hereinafter, referred to as the "fourth aspect of the invention") is a seed crystal axis used in a solution growth of single crystal production system, said seed crystal axis for solution growth of single crystal comprising a seed crystal bonded to a seed crystal support member between which is interposed a laminated wound carbon sheet having a high thermal conductivity in a direction perpendicular to a solution surface of a solvent and comprising a plurality of carbon strips with differing thicknesses which are wound and laminated from the center so that the closer to the outer periphery, the thicker.

Advantageous Effects of Invention

With each of the above aspects of the invention, a seed crystal axis for single crystal growth able to prevent or suppress formation of polycrystals due to the liquid phase technique and grow a single crystal with a high growth rate is obtained.

BRIEF DESCRIPTION OF DRAWINGS

FIG. 2 is a copy of a photograph showing the state after solution growth using the prior art.

FIG. 3 is a schematic view showing the major parts of a seed crystal axis for single crystal growth according to an embodiment of a first aspect of the invention of the present application.

FIG. 4 is a schematic view of an example of a carbon thin film (carbon sheet) used in an embodiment of the invention of the present application.

BEST MODE FOR CARRYING OUT THE INVENTION

The first to fourth aspects of the invention of the present application are seed crystal axes used in a solution growth of single crystal production system, said seed crystal axis for solution growth of single crystal comprising a seed crystal bonded to a seed crystal support member between which is interposed a laminated carbon sheet having a high thermal conductivity in a direction perpendicular to the solution surface of the material surface and comprising a plurality of carbon thin films laminated with an adhesive, a laminated carbon sheet comprising a plurality of pieces with differing lamination directions arranged in a lattice, a wound carbon sheet comprising a carbon strip wound concentrically from the center, or a laminated wound carbon sheet comprising a plurality of carbon sheets of differing thicknesses which are wound and laminated from the center so that the closer to the outer periphery, the thicker.

Below, the first to fourth aspects of the invention of the present application will be explained with reference to FIGS. 1 to 13.

Figure 1:
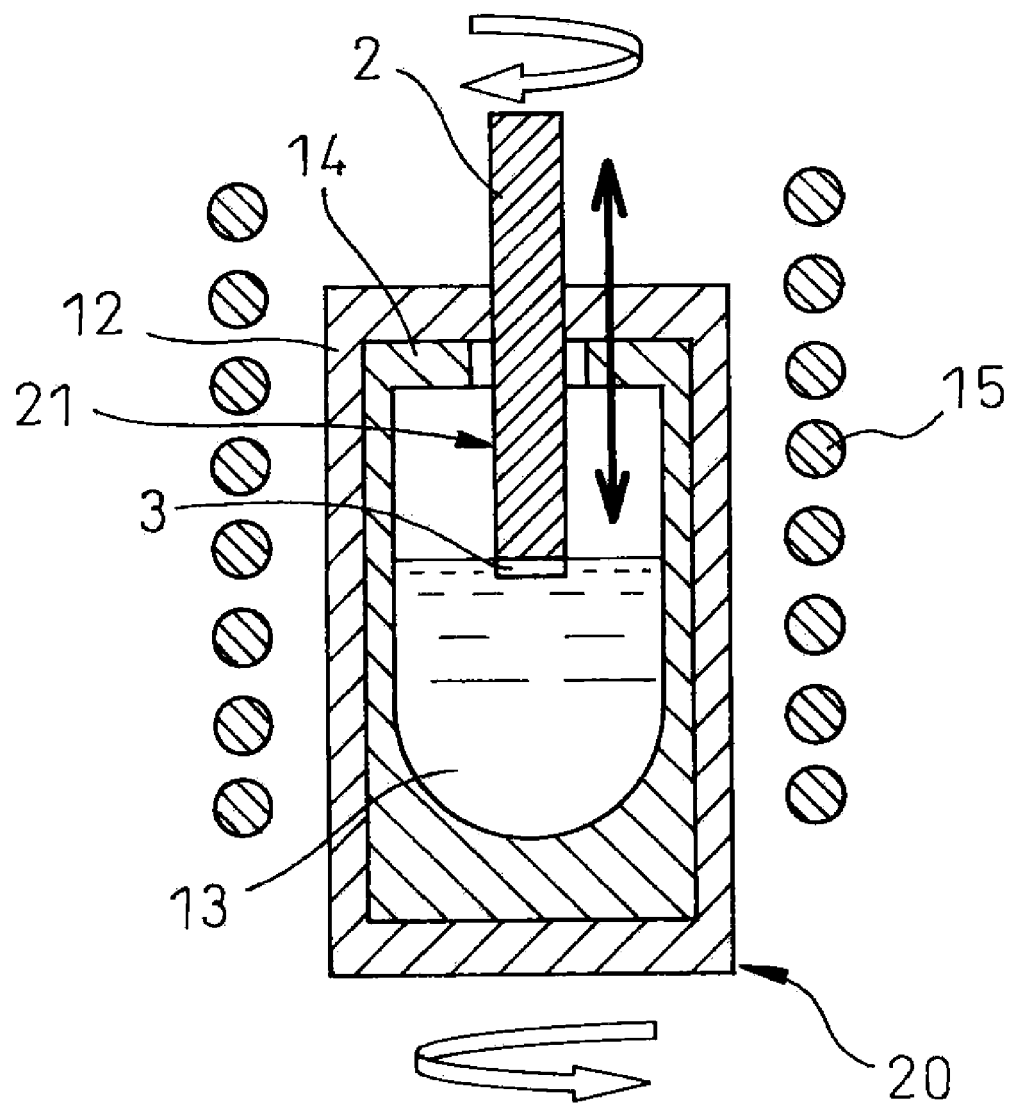
FIG. 1 is a schematic view showing the state of a solution growth using the prior art.

As shown in FIG. 1, in the schematic view showing the state of a solution growth using the prior art, a conventional SiC single crystal growth system 20 comprises a crucible 14 provided in a reaction furnace (not shown) through an insulation material 12 and containing a solvent 13, an external heating system including a high frequency coil 15 for heating the solution 13 provided around the reaction furnace, and a carbon rod 2 that can be lowered and raised (for example, graphite axis), the tip of which carbon rod 2 is provided with a seed crystal 3. In FIG. 1, the conventional seed crystal axis 21 for solution growth of single crystal is comprised of a carbon rod 2 directly bonded to a seed crystal 3 with an adhesive.

FIG. 2 shows the state after crystal growth by the liquid phase technique using a conventional seed crystal axis for solution growth of single crystal used in the conventional SiC single crystal growth system shown in FIG. 1. As shown in FIG. 2, part of the seed crystal broke off, the remainder grew into crystal, and unevenness of surface properties and differences in growth amount were observed.

FIG. 3 is a schematic view of the major parts of a seed crystal axis for single crystal growth according to an embodiment of a first aspect of the invention of the present application. The seed crystal axis 1 for single crystal growth comprises a seed crystal support member (for example, a graphite axis or other carbon rod) 2 to which a seed crystal 3 is bonded between which is interposed a laminated carbon sheet 4 having a high thermal conductivity in a direction perpendicular to a solution surface of a solvent, that is, the same direction as the axial direction of the seed crystal support member and comprising a plurality of carbon thin films laminated with an adhesive.

The laminated carbon sheet in the first aspect of the invention for example comprises a plurality of carbon thin films shown in FIG. 4 (hereinafter, also called "carbon sheets") laminated with an adhesive.

Figure 5:
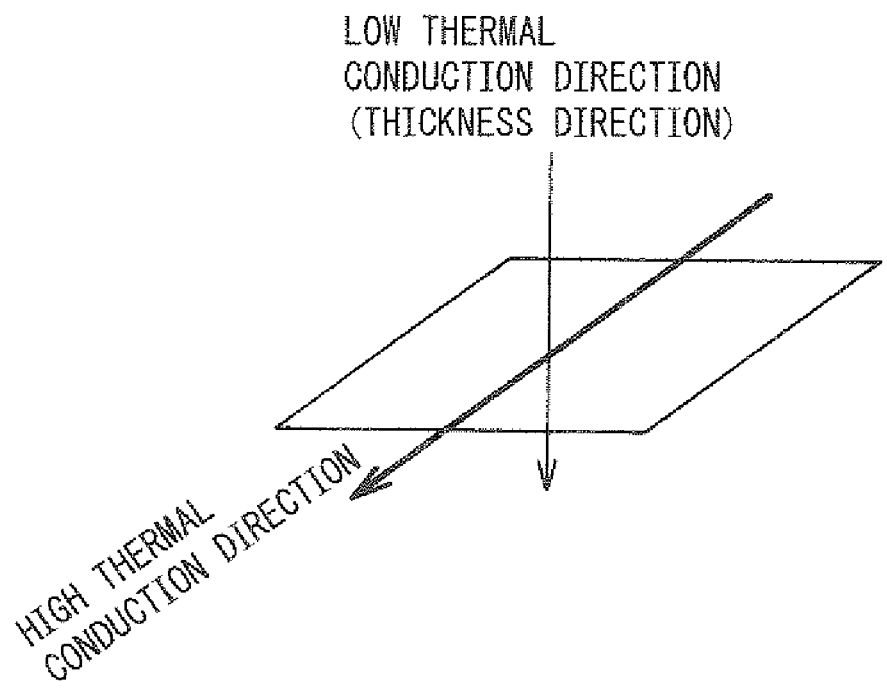
FIG. 5 is a schematic view showing anisotropy of a carbon thin film (carbon sheet) used in an embodiment of the invention of the present application.

Each carbon sheet is thin, normally having 0.15 to 6 mm thickness, particularly 0.15 to 0.6 mm thickness, and as shown in FIG. 5, has anisotropy in thermal conductivity. With respect to the thermal conductivity anisotropy, the carbon sheet has a high thermal conduction in the roll press direction of the time of production, that is, has a thermal conductivity of normally about 200 to 600 W/mK, and has a low thermal conduction in the thickness direction, that is, has a thermal conductivity of normally about 5 to 10 W/mK, so has a thermal conductivity of approximately more than 100 times that in the thickness direction. These values are remarkable in anisotropy compared with the thermal conductivity of 200 to 350 W/mK of SiC single crystal, thermal conductivity of 120

W/mK of isotropic graphite, and the 174 W/mK (axial direction) and 75 W/mK (perpendicular direction) of extruded graphite.

Figure 6:
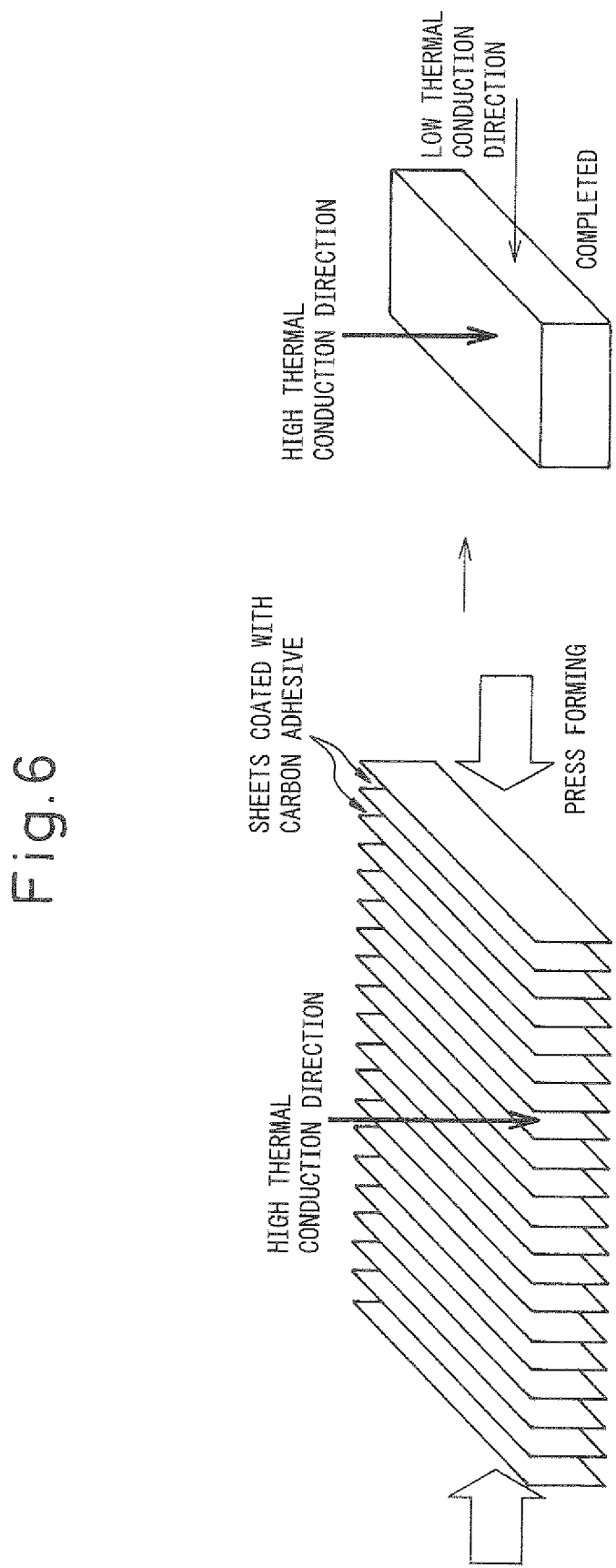
FIG. 6 is a schematic view showing the process for obtaining a laminated carbon sheet used in an embodiment of the invention of the present application.

A laminating method for obtaining a laminated carbon sheet in the first aspect of the invention using this carbon sheet is shown in FIG. 6. A plurality of carbon sheets, for example 5 to 100, for example 10 to 50, are arranged aligned in the same thermal conduction direction when each sheet is rectangular as shown in FIG. 6 or aligned so that the directions of thermal conduction are the same or arbitrarily when each sheet is a square. The sheets are coated with a carbon adhesive and press formed for lamination whereby a block-shaped laminated carbon sheet shown at the right in FIG. 6 can be obtained. At time of press molding, it is preferable to degrease and fire the sheets in the pressed state to firmly fix the sheets to each other. This laminated carbon sheet has, as shown in FIG. 6, a high thermal conduction direction (normally, thermal conductivity: 200 to 600 W/mK) and a low thermal conduction direction. By lamination of the carbon sheets so that the directions of thermal conductivity become arbitrary, it is possible to eliminate the thermal conductivity anisotropy that slightly exists at the two surface directions of the carbon sheets (X-axial direction, Y-axial direction). Further, sheets with a higher mechanical strength than the carbon sheets can be interposed at any positions between the carbon sheets then the sheets laminated.

This laminated carbon sheet may be shaped so that the high thermal conduction direction (Z-axial direction) of the laminated carbon sheet becomes perpendicular with the solution surface of the solvent and therefore matches with the axial direction of the seed crystal support member and the outer periphery of the laminated carbon sheet and the outer periphery of the seed crystal match and may be bonded with the seed crystal support member by the carbon adhesive, then a seed crystal stuck to and joined with the laminated carbon sheet surface by the carbon adhesive to obtain a seed crystal axis for single crystal growth of the first aspect of the invention.

This block-shaped laminated carbon sheet can be formed by cutting using, for example, a band saw or cutter. The laminated carbon sheet formed in the block shape is preferably finished to a #80 to #400 polished surface at the two surfaces perpendicular to the thermal conduction direction forming the bonding surfaces with the seed crystal support member and seed crystal so as to adjust the in-plane waviness to be within ±10 μm.

According to the seed crystal axis for single crystal growth of the first aspect of the invention, the laminated carbon sheet is comprised of a laminate of a plurality of thin carbon sheets as mentioned before, so can absorb the large thermal stress at a high temperature arising from the difference in the thermal expansion coefficients of the laminated carbon sheet and seed crystal and can prevent seed crystal breakage, peeling, and detachment due to thermal stress. Further, due to the high thermal conductivity of the heat removing direction, the single crystal growth rate can be improved.

Further, thin carbon sheets, in comparison to solid carbon, have low wettability, so sticking of the solvent is difficult thereby allowing suppression of formation and growth of polycrystals due to adhesion of the solvent.

For the outer periphery of the seed crystal and accordingly the outer shape of the seed crystal, a circular shape is general, but equilateral triangular, square, rhomboid, or hexagonal shapes are also possible.

Figure 7:
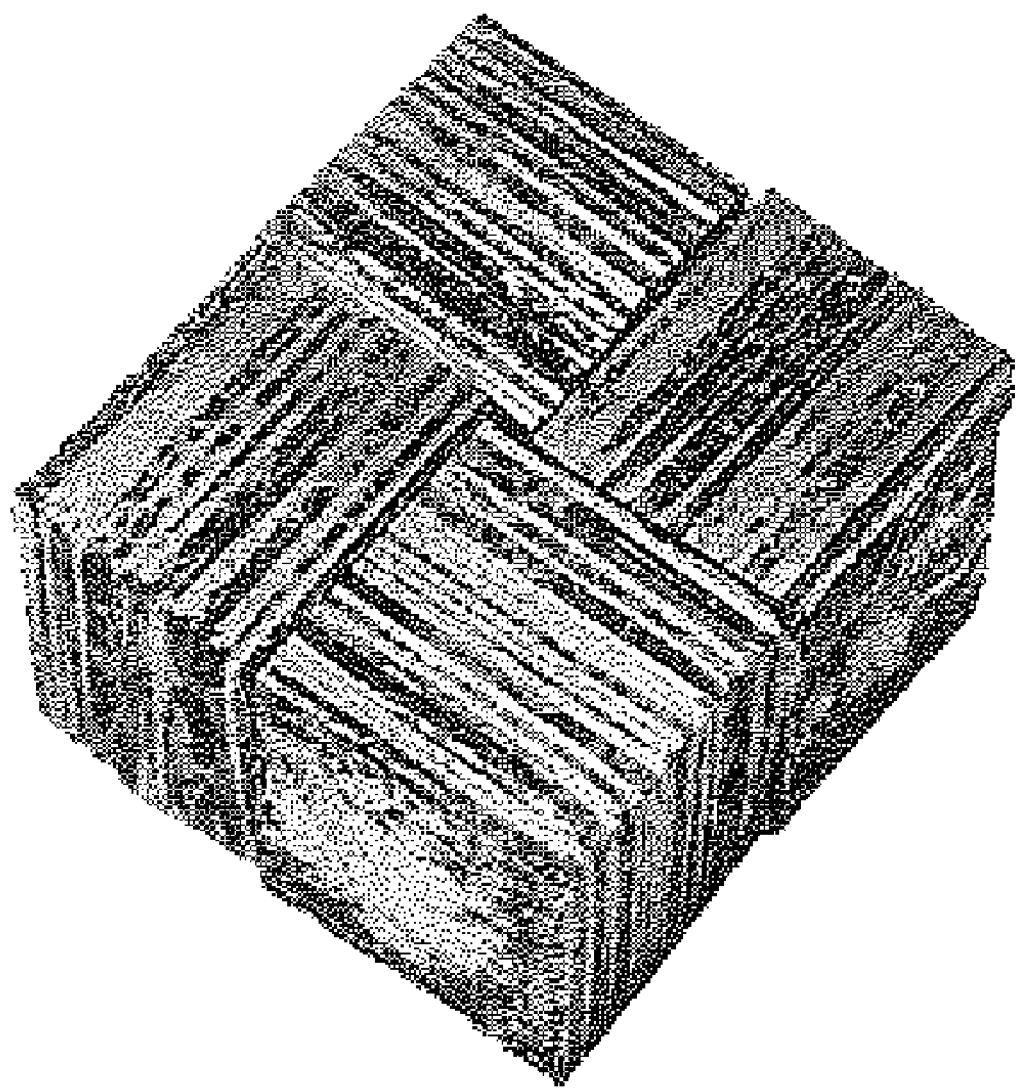
FIG. 7 is a schematic view of a laminated carbon sheet comprising pieces arranged in a lattice shape used in a second aspect of the invention of the present application (hereinafter, also simply referred to as a "lattice-arranged laminated carbon sheet").

FIG. 7 is a schematic view of a lattice-arranged laminated carbon sheet used in an embodiment of the second aspect of the invention. In the case of the lattice-arranged laminated carbon sheet, the seed crystal is bonded to the seed crystal support member between which is interposed a laminated carbon sheet comprising a plurality of, for example, four or more or for example four to eight, pieces of carbon thin films laminated with an adhesive in different lamination directions arranged into a lattice. The lattice-arranged laminated carbon sheet is obtained by cutting the laminated carbon sheet shown at the right of FIG. 6 for example into a predetermined size. FIG. 7 shows a laminated carbon sheet having an outer periphery with a specific shape of a square shape, however, the outer periphery can be any other shape, for example, it may have a equilateral triangular, circular, rhombod, or hexagonal shape as well. Further, the plurality of pieces may be bonded at the contiguous surfaces by a carbon adhesive. Sheets with mechanical strength larger than the carbon sheets may be interposed at any positions of the carbon sheets.

Figure 8:
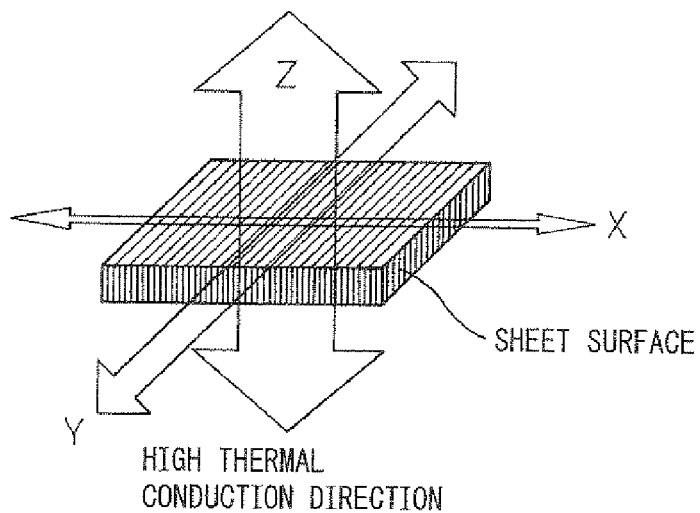
FIG. 8 is a schematic view showing the anisotropy of a laminated carbon sheet used in an embodiment of the first aspect of the invention of the present application.

By using this laminated carbon sheet comprising a plurality of pieces arranged in a lattice shape, the slight anisotropy that exists, for example, between the direction exhibiting a large thermal conductivity (Z-axial direction) and the two directions perpendicular to this (X-axial direction and Y-axial direction) as shown by the large and small arrows shown in FIG. 8 in the case the laminated carbon sheet of the first aspect of the invention, that is, when laminating the carbon sheets aligned in the same thermal conductivity direction as shown in FIG. 6, is eliminated.

Figure 9:
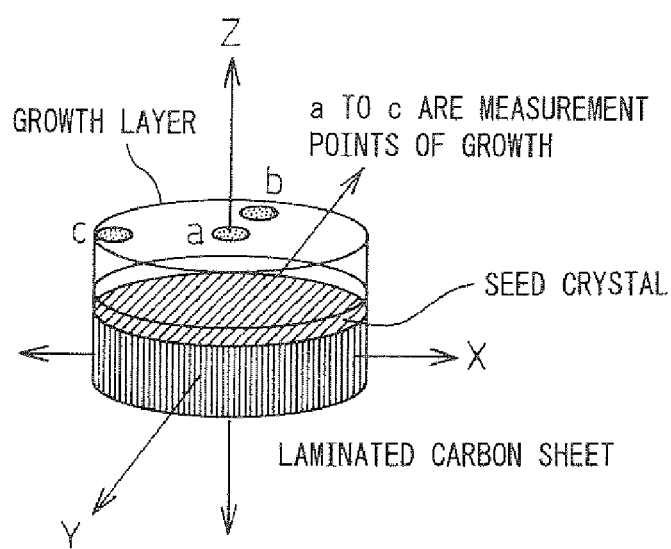
FIG. 9 is a schematic view showing the measurement position for the amount of solution growth using a seed crystal axis for single crystal growth of an embodiment of the first aspect of the invention of the present application.

The anisotropy of the laminated carbon sheet in the first aspect of the invention, as shown in FIG. 9, appears slightly depending on the measurements points on the crystal growth layer of the seed crystal.

The second aspect of the invention has an important meaning in practice since carbon sheets are usually easily available in a rectangular shape.

The block-shaped laminated carbon sheet shown in FIG. 7 may be shaped so that the high thermal conduction direction (Z-axial direction) of the laminated carbon sheet becomes perpendicular with the solution surface of the solvent and therefore matches with the axial direction of the seed crystal support member and the outer periphery of the laminated carbon sheet and the outer periphery of the seed crystal match and may be bonded with the seed crystal support member by the carbon adhesive, then a seed crystal stuck to and bonded with the laminated carbon sheet surface by the carbon adhesive to obtain a seed crystal axis for single crystal growth of the second aspect of the invention.

This block-shaped laminated carbon sheet can be formed by cutting in the same way as above. The laminated carbon sheet formed in the block shape is preferably finished to a polished surface at the two surfaces perpendicular to the thermal conduction direction forming the bonding surfaces with the seed crystal support member and seed crystal so as to adjust the in-plane waviness to be within ±10 μm.

According to the seed crystal axis for single crystal growth of the second aspect of the invention, in addition to the effects from the first aspect of the invention, the following effects are obtained. That is, in the laminated carbon sheet in the first aspect of the invention, the thermal conductivity, as shown in FIG. 8, can have a relative magnitude of Z-axial direction>>Y-axial direction>X-axial direction, however, in the laminated carbon sheet in the second aspect of the invention, this is eliminated, so the heat distribution at the X-Y plane is uniform and, further, a high quality single crystal is obtained. Further, the ability to ease the thermal stress is also made uniform on the X-Y plane, so the effect of preventing seed crystal breakage, peeling, and detachment further improves.

Figure 10:
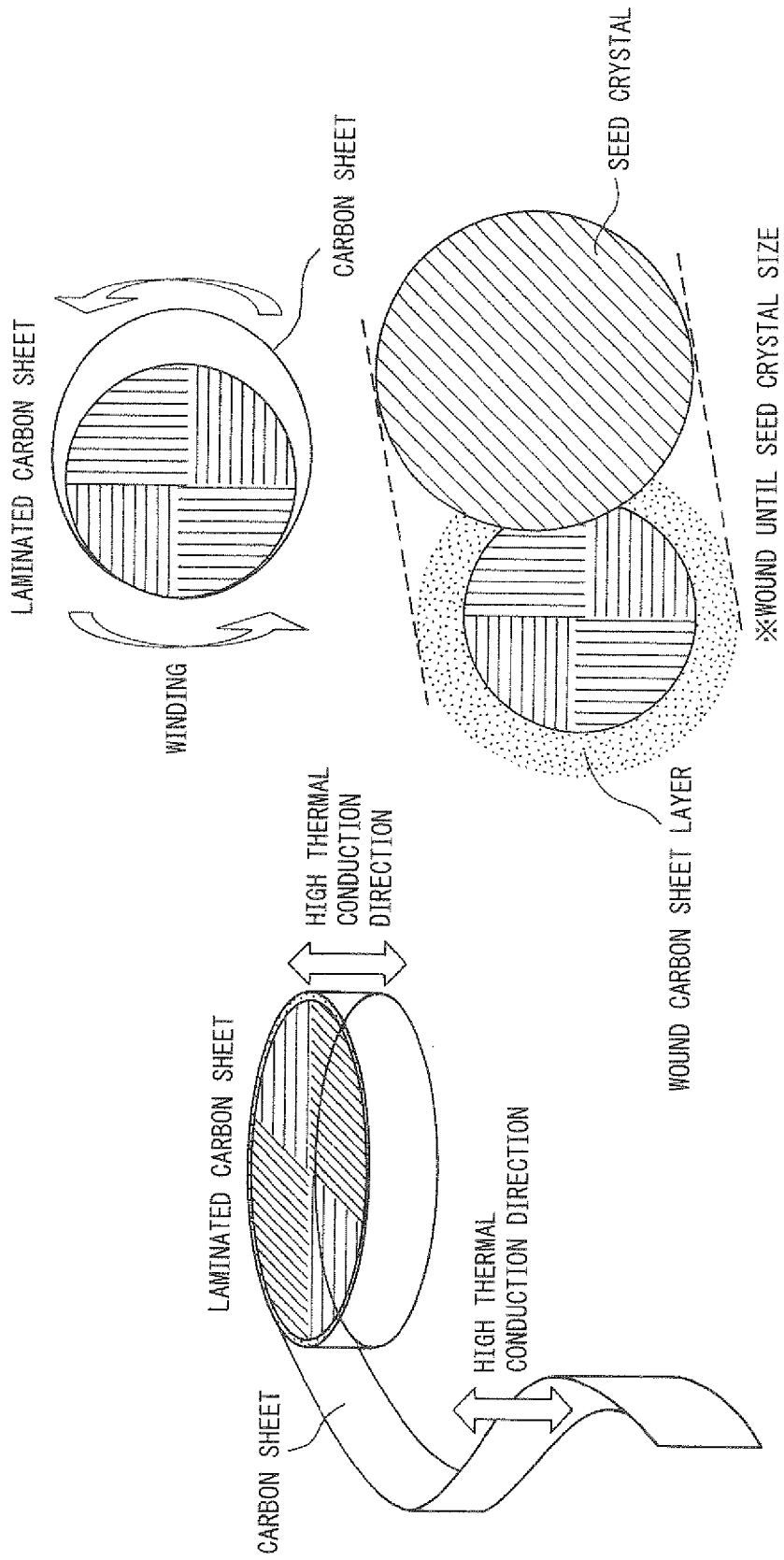
FIG. 10 is a schematic view showing a process for obtaining a laminated carbon sheet used in another embodiment of the second aspect of the invention of the present application.

FIG. 10 is a schematic viewing showing the process for obtaining the laminated carbon sheet used in another embodiment of the second aspect of the invention of the present application. As shown in FIG. 10, a laminated carbon sheet having a wound carbon sheet layer is obtained by wrapping a carbon sheet around the outer periphery of a laminated carbon sheet formed so that it substantially matches the outer periphery of a seed crystal, an example of which is shown in FIG. 7. This laminated carbon sheet comprises, as shown in the bottom right of FIG. 10, a plurality of pieces of carbon thin films laminated with an adhesive with differing lamination directions arranged into a lattice. Further, the outer periphery of the laminated carbon sheet having the wound carbon sheet layer has the same shape as the outer periphery of the seed crystal. Further, the wound carbon sheet layer is fixed to the laminated carbon sheet by a carbon adhesive.

The laminated carbon sheet having the wound carbon sheet layer shown at the bottom right of FIG. 10 may be used, in the same way as the above, to make the high thermal conduction direction of the laminated carbon sheet perpendicular to the solution surface of the solvent and bond it with the seed crystal support member, then the seed crystal may be stuck and bonded to the surface of the laminated carbon sheet by a carbon adhesive to obtain a seed crystal axis for single crystal growth of the second aspect of the invention.

By the seed crystal axis for single crystal growth of the second aspect of the invention using the laminated carbon sheet having the wound carbon sheet layer shown at the bottom right of FIG. 10, in addition to having the effects of the second aspect of the invention, it is possible to prevent intrusion of the solvent to the adhesive layer that occurs from the contact of the solvent with the outer peripheral portion of the carbon sheet and enable stabilized growth over a long period of time.

Figure 11:
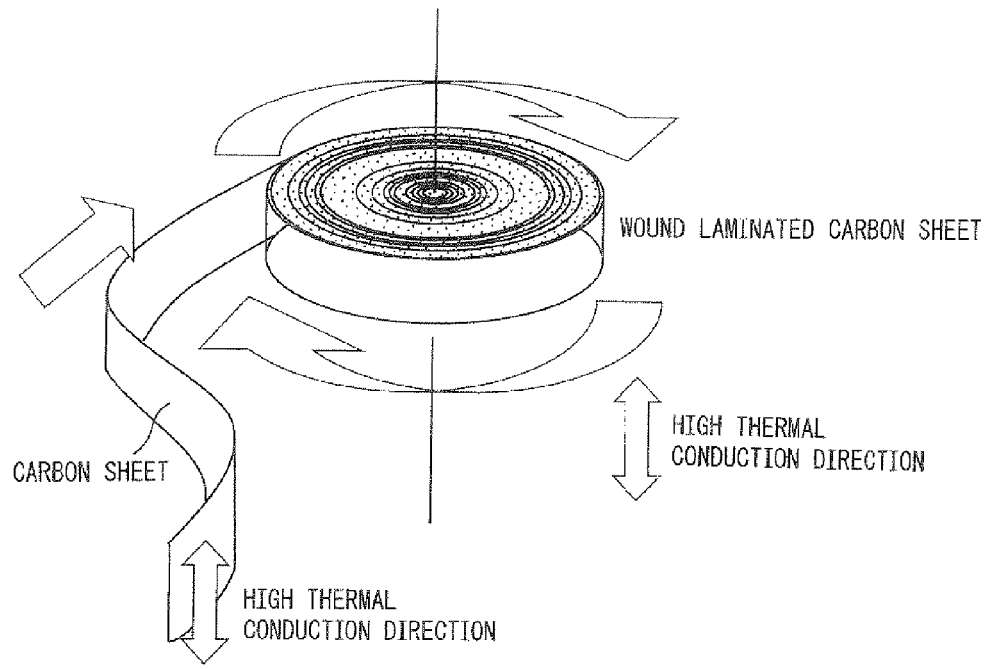
FIG. 11 is a schematic view showing a process for obtaining a wound laminated carbon sheet used in an embodiment of a third aspect of the invention of the present application.

FIG. 11 is a schematic view showing a process for obtaining a wound laminated carbon sheet used in an embodiment of the third aspect of the invention. As shown in FIG. 11, the wound laminated carbon sheet in the third aspect of the invention can be obtained by winding a long carbon sheet or a large number of carbon sheets connected in series concentrically from the center so that the high thermal conduction direction becomes a direction perpendicular to the solution surface of the solvent and therefore the axial direction of the seed crystal support member, then bonding and laminating part or all of the surfaces between the carbon sheets using a carbon adhesive. Sheets with higher mechanical strength than the carbon sheets may be inserted between the long carbon sheets.

This wound carbon sheet may be used, in the same way as the above, to make the high thermal conduction direction of the wound carbon sheet the perpendicular direction with the solution surface of the solvent and therefore match with the axial direction of the seed crystal support member for bonding with the seed crystal support member, then the seed crystal may be stuck and bonded to the surface of the laminated carbon sheet by a carbon adhesive to obtain a seed crystal axis for single crystal growth of the third aspect of the invention.

By the seed crystal axis for single crystal growth of the third aspect of the invention using the wound laminated carbon sheet shown in FIG. 11, in addition to the effects of the first and second aspects of the invention, the uniformity of the effect of easing thermal stress is improved more and the bonding portion is not exposed at the outer most periphery, so it is possible to suppress sticking and intrusion of the solvent on the bonding portion.

Figure 12:
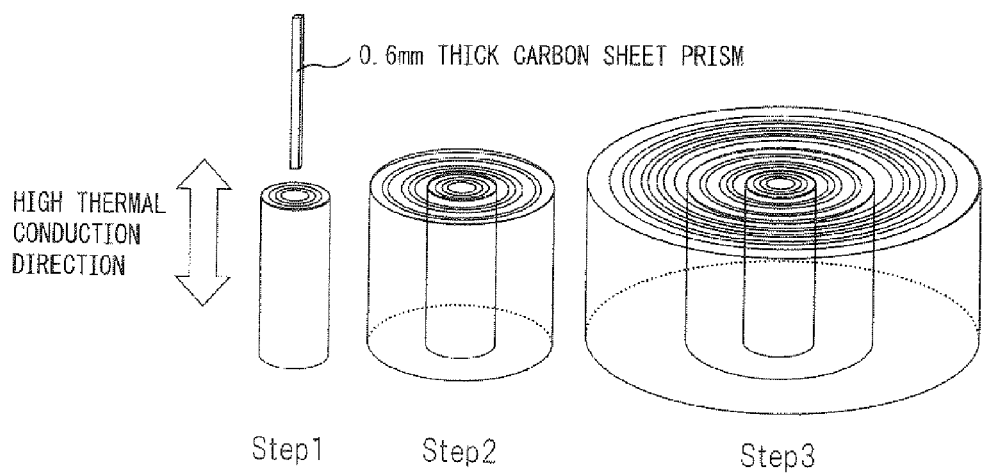
FIG. 12 is a schematic view showing a process for obtaining a multistep wound laminated carbon sheet used in an embodiment of a fourth aspect of the invention of the present application.

FIG. 12 is a schematic view showing a process for obtaining a multistep wound laminated carbon sheet used in an embodiment of a fourth aspect of the invention. As shown in FIG. 12, the multistep wound laminated carbon sheet in the fourth aspect of the invention can be obtained, as shown in FIG. 12, by using a bar-shaped, for example, 0.6 ram bar-shaped, or cylinder-shaped thick carbon sheet as a core and using long carbon sheets having different thicknesses to wind around it a plurality of times, for example, 3 to 6 times, for example, in FIG. 13, 3 times, while increasing the thickness of the carbon sheet for each step, winding concentrically and circularly around the center so that the high thermal conduction direction is the direction perpendicular to the solution surface of the solvent and therefore the axial direction of the seed crystal support member, and bonding part or all of the surfaces between the layers of the carbon sheet by a carbon adhesive. As the long carbon sheets with different thicknesses, it is preferable to use a carbon sheet with a thickness of about 0.15 to 0.3 mm at step 1 shown in FIG. 12, one with a thickness of 0.3 to 0.45 mm at step 2, and one with a thickness of 0.5 to 0.6 mm at step 3.

This multistep wound carbon sheet may be used, in the same way as above, to bond with seed crystal support member so that the high thermal conduction direction of the multistep wound carbon sheet becomes the perpendicular direction with the solution surface of the solvent and therefore matches the axial direction of the seed crystal support member and then the seed crystal stuck and bonded to the surface of the laminated carbon sheet by a carbon adhesive to obtain a seed crystal axis for single crystal growth of the fourth aspect of the invention.

The seed crystal axis for single crystal growth of the fourth aspect of the invention using the multistep wound carbon sheet shown in the right drawing (step 3) of FIG. 12, in addition to having the effects of the third aspect of the invention, can make the laminate density highly dense, so can further increase the thermal conductivity and improve the growth rate. Further, in addition to the effects of the second aspect of the invention, the bonding portion at the outer most periphery is not exposed, so the sticking and intrusion solvent at the bonding portion can be suppressed.

The seed crystal support member for each of the first to fourth aspects of the invention is not particularly limited. For example, a carbon rod, for example, a graphite axis, may be mentioned. A carbon rod is normally 200 to 600 mm long and may have a cylindrical or bar shape. Further, the vicinity that bonds to the laminated carbon sheet, wound carbon sheet, or laminated wound carbon sheet may have a cone or pyramid shape.

Further, the carbon adhesive is not particularly limited and may be mixture containing carbon and a thermosetting resin.

According to the crystal growth seed crystal axes of the first to fourth aspects of the invention, a thermal conductivity 50 to 100 times that of a conventional carbon sheet set crystal axis is obtained.

Further, according to the seed crystal axes for single crystal growth of the first to fourth aspects of the invention, application is possible even with a seed crystal with a comparatively large size, for example a maximum size (equivalent to the diameter when the outer periphery is circular) of 1 inch (2.5 cm) or more, for example, 2 inches (5.1 cm) or more, and among those a 3 to 6 inch (7.6 to 15.2 cm) area.

Figure 13:
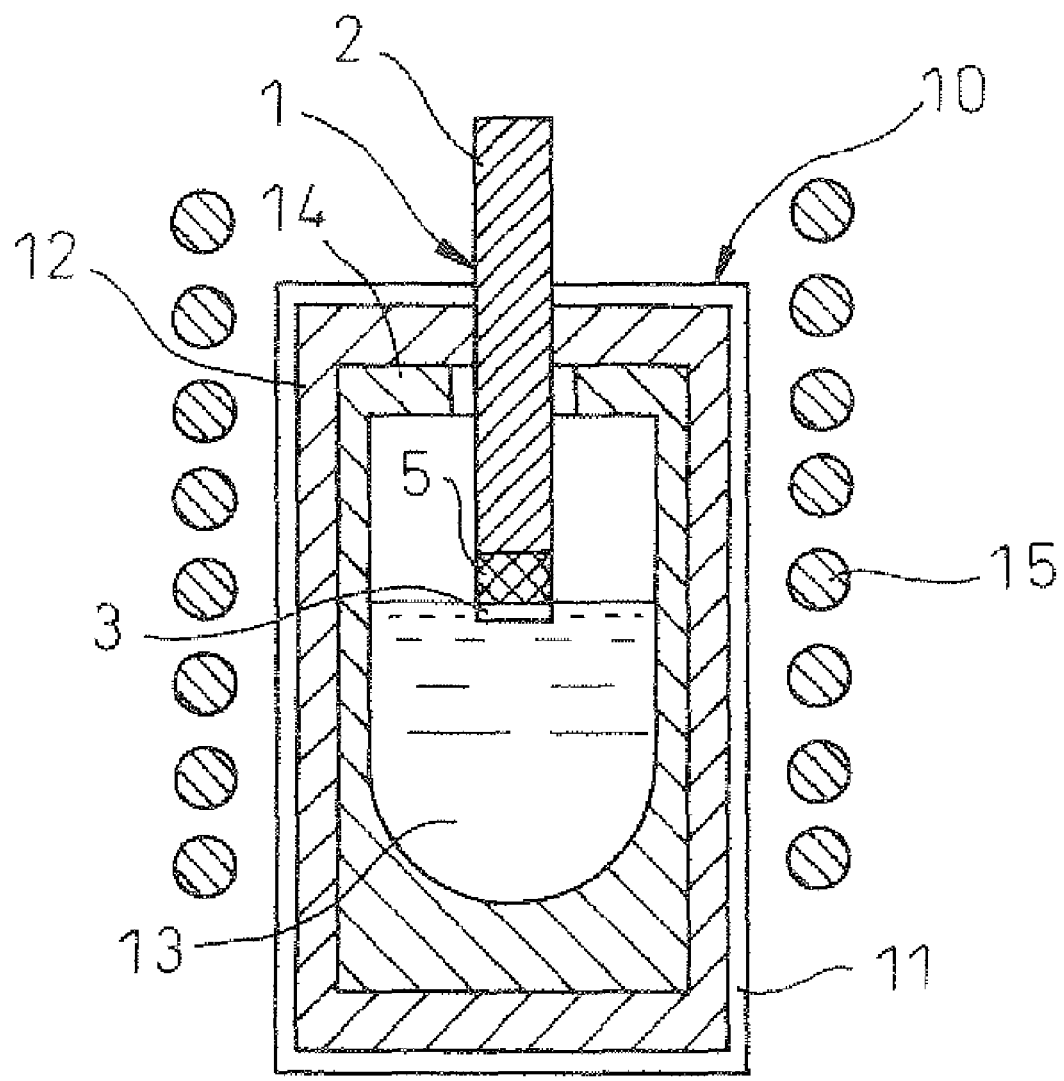
FIG. 13 is a schematic view of an example of a solution method-based SiC single crystal growth system which uses the seed crystal axis for single crystal growth of an embodiment of the invention of the present application.

The seed crystal axes for solution growth of single crystal of the first to fourth aspects of the invention can be applied to a growth system for obtaining any single crystal by the liquid phase technique. The single crystal is not particularly limited so long as it requires crystal growth of a single crystal at a high temperature. For example, an SiC single crystal may be mentioned. If applying the seed crystal axis for solution growth of single crystal of any of the first to fourth aspects of the invention to an SiC single crystal growth system, as shown in FIG. 13 for example, SiC single crystal growth system using seed crystal axis for single crystal growth 10 is provided with a crucible 14 containing a solvent 13 provided in a reaction furnace 11 through an insulation material 12, an external heating system including a high frequency coil 15 for heating the solvent 13 provided around the reaction furnace, and a seed crystal axis for single crystal growth 1 that can be lowered and raised, said seed crystal axis comprising a seed crystal 3 bonded to a carbon rod 2 between which is interposed a laminated carbon sheet having a high thermal conductivity in the direction perpendicular to the solution surface of the solvent and comprising a plurality of laminated carbon thin films, a laminated carbon sheet comprising a plurality of pieces with differing lamination directions arranged in a lattice shape, a wound carbon sheet comprising a carbon strip wound concentrically from the center, or a laminated wound carbon sheet 5 comprising a plurality of carbon strips of differing thicknesses laminated and wound from the center so that the closer to the outer periphery, the thicker it becomes.

As the solvent, any solution having Si and C as essential ingredients can be mentioned. For example, as the solvent, one that further contains Ti and/or Cr, for example, an Si—Ti—C solution, or one containing Ni and having a ratio to Ni (atomic ratio) (Ni/Cr) of 0.2 or less, for example, one containing one element selected from among rare earth elements, transition metal elements, and alkali earth metal elements and is an element other than Si, Cr, Ni and C, for example, the element being Ce, may be mentioned.

The temperature of the solvent is 1600 to 2050° C., and within that, 1800 to 2050° C., particularly around 1850 to 2050° C. is possible.

Figure 16:
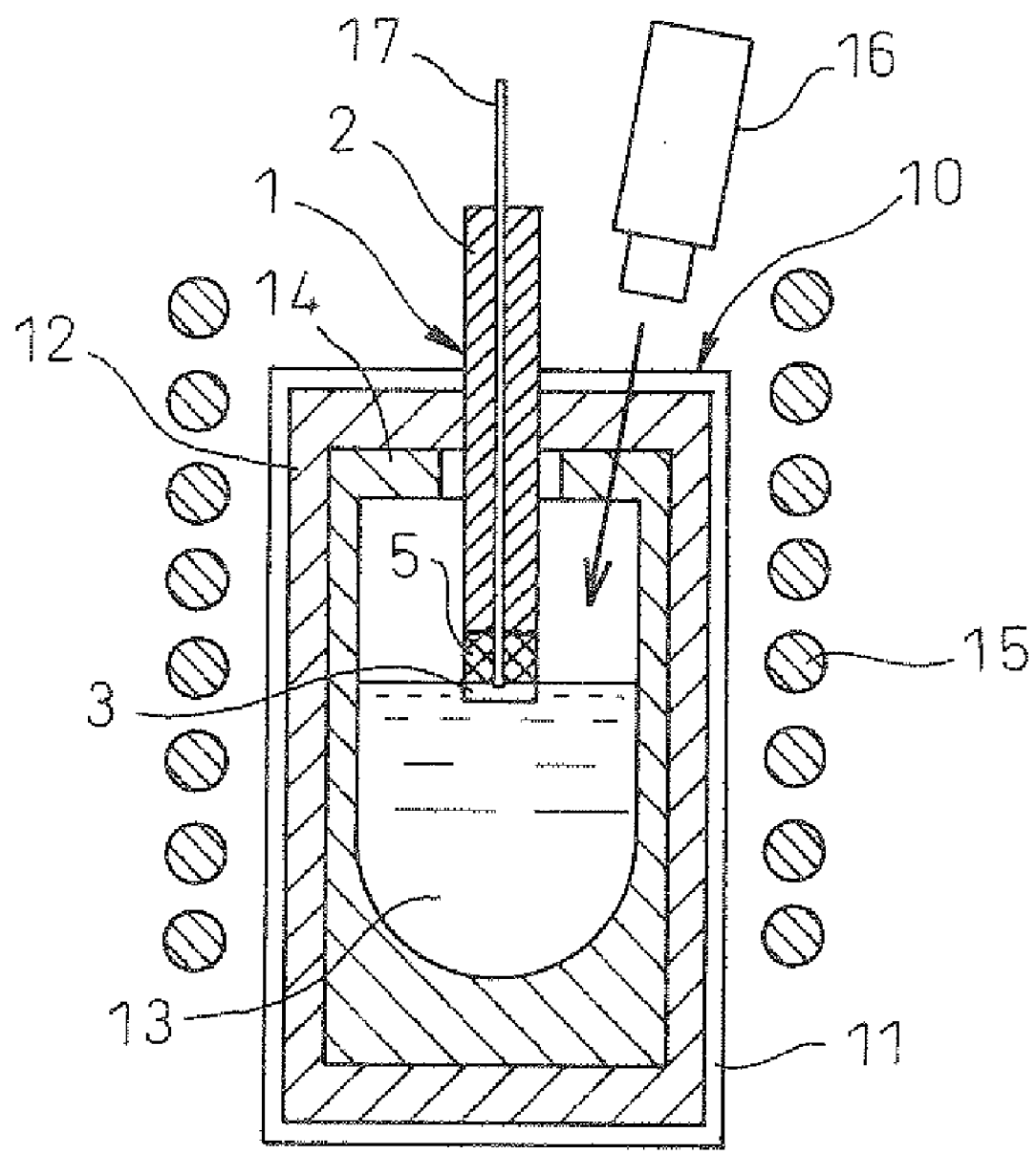
FIG. 16 is a schematic view showing a measurement method of the solvent temperature in the liquid phase technique.

The temperature control comprises, as shown in FIG. 16 for example, heating with high frequency induction heating, observing the temperature of the solvent surface with a radiant thermometer for example shown in FIG. 16 and/or using a thermocouple arranged in the inner side of the carbon rod, for example a W—Re (tungsten/rhenium) thermocouple, to measure the temperature, and controlling by a temperature control system (not shown) based on the measured temperature.

The method for producing an SiC single crystal using the solution growth of SiC single crystal system is itself a known solution growth production method and can be carried out by appropriately selecting optimum conditions from, for example, the graphite crucible shape, heating method, heating time, atmosphere, temperature increase rate, and cooling rate.

For example, the heating time for high frequency induction heating (approximately the time it takes to reach SiC saturation concentration from charging the material) depends on the size of the crucible but can be around 20 minutes to 10 hours (for example, around 3 to 7 hours), and the atmosphere can be a rare gas, for example He, Ne, Ar, or other inert gas or one of the same having a portion substituted with $N_2$ or methane gas.

By using the above solution growth of SiC single crystal system, it is possible to prevent or suppress polycrystal growth and grow an SiC single crystal with a high growth rate at the above temperature for a long period of time, for example, two or more hours.

EXAMPLES

Below, the present invention will be explained more specifically with examples and comparative examples, however, the present invention is not limited to the examples below.

In each of the following examples, an SiC single crystal was grown using the solution growth of SiC single crystal production system shown in FIG. 13. Further, the high temperature (2000 to 2050° C.) of the solvent was confirmed using the mode for measuring the surface temperature shown in the schematic view in FIG. 16. A radiant thermometer was set at an observation window above the solution where the solution surface can be directly observed, and the temperatures before and after bringing the seed crystal into contact with the solution were measured. Further, a thermocouple was arranged at the inner side of the seed crystal axis for single crystal growth (a position 2 mm from the seed crystal), and the temperature from immediately after solvent contact was measured.

Further, in each of the following examples, as the carbon adhesive, the adhesive usually called the "composition A" was used.

Carbon Adhesive Composition of Composition A

| | |
|---|---|
| Phenol resin ($C_6H_6O \cdot CH_2O$) | 45 mass % |
| Phenol ($C_6H_6O_{14}$) | 14 mass % |
| Water | 1 mass % |
| Carbon (solid) (C) | 40 mass % |

This composition A carbon adhesive is coated uniformly on the graphite axis, seed crystal bonding surface, and carbon sheet at the inner surfaces.

Examples 1 to 2

Two types of laminated carbon sheets with thicknesses of 5 mm and 20 mm were prepared using 0.4 mm thick carbon sheets according to the process of obtaining a laminated carbon sheet shown in the schematic view in FIG. 6, then single crystal growth seed crystal axes were prepared by the following process.

1) Coat the composition A carbon adhesive uniformly on the carbon sheets.

2) Match the surfaces, apply a load of around 0.5 to 2.0 kgf on the bonding surfaces while heating to approximately 200° C., then carrying out primary degreasing and fixing (with the wound laminated type to be mentioned later, no load).

3) Place this in a heating atmosphere (degreasing furnace and firing furnace) for heat treatment of the adhesive. At this time, similar to 2), apply a load of around 0.2 to 2.0 kgf.

Heating conditions: 200° C.×1 hour and 700° C.×3 hours, then cool in the furnace to end the process.

The obtained single crystal growth seed crystal axis was used to prepare an SiC single crystal growth system and perform solution growth of SiC single crystal. Si, Cr, and Ni were added simultaneously to the graphite crucible, heating was continued for around 2 to 3 hours to maintain a setting temperature (1800 to 2100° C.), then when C dissolves from the graphite crucible and the SiC saturation concentration is reached, an SiC single crystal attached to the tip of the single crystal growth seed crystal axis was dipped in the solution. The cooling water temperature from an axis cooling system (not shown) was made 17.5° C. The temperature was held to the setting temperature of the solvent, then an SiC single crystal was grown on the SiC single crystal. After a specified growth time passed, the grown crystal was completely pulled up from the solvent and the graphite crucible was cooled until room temperature to thereby obtain an SiC single crystal. The growth rate was measured and the area around the SiC seed crystal was observed to evaluate the degree of precipitation of other crystals (including polycrystals).

Whether the SiC crystal obtained in each example was a single crystal or polycrystal was confirmed by X-rays (XRD).

The effects on the growth rate due to the type of crystal axis are shown with the results of Comparative Example 1 in Table 1, while the effects on polycrystal precipitation due to the type of crystal axis are shown with the results of other examples in Table 5.

Comparative Example 1

Except for using a carbon sheet (low thermal conductivity direction in the graphite axis direction) instead of laminated carbon sheet, the same procedure was used as in Example 1 to obtain a crystal axis comprising a seed crystal+carbon sheet (low thermal conductivity direction)+graphite axis structure.

Using the SiC single crystal growth system applying this crystal axis, solution growth of SiC single crystal was carried out and the growth rate was measured.

The effects on growth rate due to the type of crystal axis are shown with the results of Examples 1 to 2 in Table 1.

TABLE 1

|  | Comparative Example 1 Seed crystal + carbon sheet + graphite axis | Example 1 Seed crystal + laminated carbon sheet + graphite axis | Example 2 Seed crystal + laminated carbon sheet + graphite axis |
|---|---|---|---|
| Sheet thickness mm | 0.2 | 20 | 5 |
| Growth rate μm/mm | 356 312 362 | 812 870 — | 907 964 — |

Comparative Example 2

Except for not using a laminated carbon sheet, the same procedure was used as in Example 1 to obtain a crystal axis comprising a seed crystal++graphite axis structure.

Figure 15:
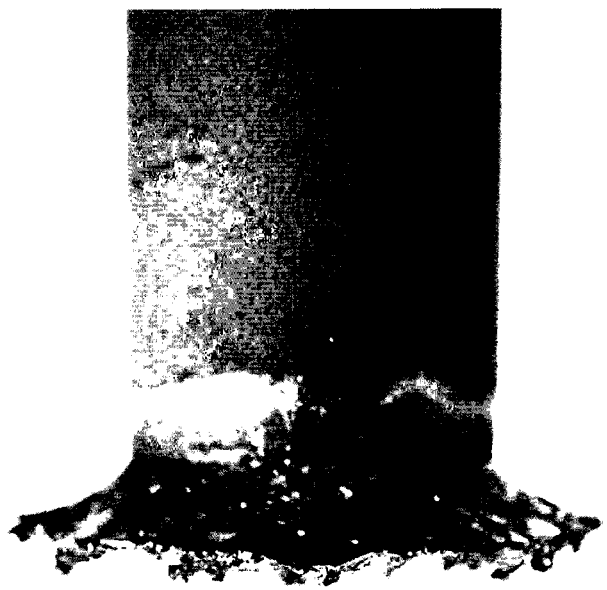
FIG. 15 is a copy of a photograph of the state of finishing tests of solution method-based SiC single crystal growth using a seed crystal axis for single crystal growth of prior art.

Except for using an SiC single growth system applying this crystal axis, the same procedure was performed as in Example 1 to perform solution method-based SiC single crystal growth. A copy of a photograph of the area around the seed crystal after 2 hours of crystal growth is shown in FIG. 15. The state shown in this picture was used for evaluation criteria of the state of polycrystal precipitation (*2, evaluation: poor).

Further, the effects on polycrystal precipitation due to the type of crystal axis were shown together with the results of other examples in Table 5.

Example 3

Except for preparing a 5 mm thick laminated carbon sheet in the same way as Example 2 and using a lattice-arranged laminated carbon sheet made by cutting this laminated carbon sheet into four equal pieces and arranging and bonding each piece by a carbon adhesive as shown in FIG. 7, the same procedure as in Example 1 was used to prepare a seed crystal axis for single crystal growth.

Except for using an SiC single crystal growth system applying this crystal axis and making the cooling water temperature 25.2° C., the same procedure was performed as in Example 1 for solution growth of SiC single crystal. The amount of growth of single crystal was evaluated at differing measurement positions as shown in FIG. 9.

Further, the effects on the growth rate due to the type of crystal axis are shown in Table 2 together with a comparison of applying the seed crystal axis for single crystal growth of Example 2. In Table 2, the average growth amounts at the positions in FIG. 9 in the growth plane are indicated as the hourly average growth amount in 2 hours of growth. Note that, a, b, and c in Table 2 indicate the measurement positions in FIG. 9, and b' and c' indicate the second test values at the same positions.

TABLE 2

|  | Measurement position | y-direction end | | z-direction end | | Center |
|---|---|---|---|---|---|---|
|  |  | b | b' | c | c' | a |
| Example 2 | Normal laminate | 472 | 452 | 412 | 399 | 465 |
| Example 3 | Lattice-arranged laminate | 505 | 498 | 502 | 512 | 509 |

Unit: μm

Example 4

Figure 14:
FIG. 14 is a copy of a photograph of the state after finishing tests of an example of solution method-based. SiC single crystal growth using a seed crystal axis for single crystal growth of an embodiment of the invention of the present application.

Using a lattice-arranged laminated carbon sheet prepared similar to Example 3, a laterally wound carbon sheet was prepared by the process shown in the schematic view of FIG. 10. Except for applying this laterally wound carbon sheet, the same procedure was performed as in Example 3 to prepare a single crystal growth seed crystal axis. Except for using an SiC single crystal growth system which applies this crystal axis, the same procedure was performed as in Example 3 for solution method-based SiC single crystal growth. The growth rate was estimated to be the same as Example 3, so it was not measured. A copy of a photograph of the area around the seed crystal after 2 hours of crystal growth is shown in FIG. 14. The state shown in this picture was used for evaluation criteria of the state of polycrystal precipitation (*1, evaluation: good).

Example 5

Except for using a wound carbon sheet in which a 0.5 mm thick carbon sheet was wound concentrically from the center as shown in FIG. 11, the same procedure was performed as in Example 1 to prepare a single crystal growth seed crystal axis.

Except for using an SiC single crystal growth system in which this crystal axis is applied and making the cooling water temperature 25.0° C., the same procedure was performed as in Example 1 for solution growth of SiC single crystal.

The effects on the growth rate due to the crystal axis are shown in Table 3. Further, the relationship between the wound carbon sheet density and growth rate is shown in FIG. 4. In Table 3, the average growth amounts at the three positions corresponding to those in FIG. 9 in the growth plane are indicated as the hourly average growth amount in 2 hours of growth. Further, the area around the SiC seed crystal was observed to evaluate the degree of precipitation of other crystals (including polycrystals). The results are shown together with the results of other examples in Table 5.

TABLE 3

|  | Measurement position | Any measurement point in-plane | | | | Center |
|---|---|---|---|---|---|---|
|  |  | b | c | a | d | a |
| Example 5 | Wound laminated | 387 | 377 | 380 | 372 | 380 |

Unit: μm

Example 6

Except for using the following three types of carbon sheets and winding them by the process shown in FIG. 12, the same procedure was used as in Example 1 to prepare a laminated wound carbon sheet.

Types of carbon sheets used at each step
Step 1: wound diameter: about φ8, sheet thickness: about 0.2 mm
Step 2: wound diameter: about φ8 to φ20, sheet thickness: about 0.4 mm
Step 3: wound diameter: about φ16 or more, sheet thickness: about 0.6 mm Except for using this laminated wound carbon sheet, the same procedure was performed as in Example 1 to prepare a seed crystal axis for single crystal growth. Except for using an SiC single crystal growth system in which this seed crystal axis for single crystal growth was applied and making the cooling water temperature 25.0° C., the same procedure was performed as in Example 1 for solution method-based SiC single crystal growth.

The growth rate obtained by application of this seed crystal axis for single crystal growth is shown together with the results obtained using other crystal axes in Table 4. Table 4 shows and compares the densities of the laminated carbon sheets or wound carbon sheets which are used for the crystal axes. Further, the area around the SiC seed crystal was observed to evaluate the degree of precipitation of other crystals (including polycrystals). The results are shown together with the results of other examples in Table 5.

TABLE 4

| | Lamination method | Density | Growth rate μm/mm |
|---|---|---|---|
| Example 5 | Winding | 0.51 to 0.68 | 380 |
| Example 6 | Multistep winding | 0.86 to 0.93 | 472 |
| Example 2 | Laminated carbon sheet | 1 | 520 |

TABLE 5

| | Lamination method | 1 hour | 2 hours | 5 hours |
|---|---|---|---|---|
| Comparative Example 2 | Normal bonding | Fair | Poor *2 | Poor |
| Example 2 | Laminated carbon sheet | Good | Fair | Fair |
| Example 4 | Lateral winding | Good | Good *1 | Good |
| Example 5 | Winding | Good | Good | Good |
| Example 6 | Multistep winding | Good | Good | Good |

Good: No effect on growth (an extremely small amount of precipitation if any)
Fair: Precipitation around grown crystal
Poor: Effect on growth state The results from Tables 1 to 4 show that the seed crystal axis for single crystal growth of the first to fourth aspects of the invention have improved growth rates in comparison to conventional crystal axes. Further, they show that the crystal axes of the second to third aspects of the invention have average growth amounts in the growth plane uniform throughout the entire planes.

Further, the results in Table 5 showed that the seed crystal axes for single crystal growth of the first to fourth aspects of the invention had polycrystallization suppression effects significantly improved over conventional crystal axes.

INDUSTRIAL APPLICABILITY

The seed crystal axes for single crystal growth of the first to fourth aspects of the present invention may be applied to solution growth of single crystal production systems to prevent or suppress the formation of polycrystals due to the liquid phase technique and grow single crystals, for example, SiC single crystals, with a high growth rate.

REFERENCE SIGNS LIST

| | |
|---|---|
| 1 | seed crystal axis for single crystal growth of present invention |
| 2 | seed crystal holder (carbon rod) |
| 3 | seed crystal |
| 4 | laminated carbon sheet |
| 5 | laminated carbon sheet, wound carbon sheet, or laminated wound carbon sheet |
| 10 | SiC single crystal growth system using seed crystal axis for single crystal growth of present invention |
| 11 | growth furnace |
| 12 | insulation material |
| 13 | solvent |
| 14 | crucible |
| 15 | high frequency coil |
| 16 | radiant thermometer |
| 17 | W-Re thermocouple |
| 20 | conventional SiC single crystal growth system |
| 21 | conventional SiC seed crystal axis for single crystal growth |

The invention claimed is:

1. A seed crystal axis used in a solution growth of single crystal production system, said seed crystal axis for solution growth of single crystal comprising a seed crystal bonded to a seed crystal support member between which is interposed a laminated carbon sheet having a high thermal conductivity in a direction perpendicular to a solution surface of a solvent and comprising a plurality of carbon thin films laminated with an adhesive,
   wherein the outer periphery of the laminated carbon sheet substantially matches with the outer periphery of the seed crystal.

2. A seed crystal axis used in a solution growth of single crystal production system, said seed crystal axis for solution growth of single crystal comprising a seed crystal bonded to a seed crystal support member between which is interposed a laminated carbon sheet having a high thermal conductivity in a direction perpendicular to a solution surface of a solvent and comprising a plurality of pieces of carbon thin films laminated with adhesive with differing lamination directions arranged in a lattice.

3. A seed crystal axis used in a solution growth of single crystal production system, said seed crystal axis for solution growth of single crystal comprising a seed crystal bonded to a seed crystal support member between which is interposed a wound carbon sheet having a high thermal conductivity in a direction perpendicular to a solution surface of a solvent and comprising a carbon strip wound concentrically from the center,
   wherein the outer periphery of the wound carbon sheet substantially matches with the outer periphery of the seed crystal.

4. A seed crystal axis used in a solution growth of single crystal production system, said seed crystal axis for solution growth of single crystal comprising a seed crystal bonded to a seed crystal support member between which is interposed a laminated wound carbon sheet having a high thermal conductivity in a direction perpendicular to a solution surface of a solvent and comprising a plurality of carbon strips with differing thicknesses which are wound and laminated from the center so that the closer to the outer periphery, the thicker the carbon strips become.

5. A seed crystal axis for solution growth of single crystal as set forth in claim 1, wherein the seed crystal support member is a carbon rod.

6. A seed crystal axis for single crystal growth as set forth in claim 1, wherein the laminated carbon sheet is comprised of adjoining carbon thin films between which a sheet with a mechanical strength larger than the carbon thin films is interposed.

7. A seed crystal axis for solution growth of single crystal as set forth in claim 3, wherein the wound carbon sheet is comprised of adjoining carbon strips between which a sheet with a mechanical strength larger than the carbon strips is interposed.

8. A seed crystal axis for solution growth of single crystal as set forth in claim 4, wherein the laminated wound carbon sheet is comprised of adjoining carbon strips between which a sheet with a mechanical strength larger than the carbon strips is interposed.

9. A seed crystal axis for solution growth of single crystal as set forth in claim 2, wherein the carbon sheet arranged in a lattice has a carbon strip of the same width with a high thermal conduction direction taken in the same direction as the laminated carbon sheet laminated with it.

10. A seed crystal axis for solution growth of single crystal as set forth in claim 1, wherein the seed crystal axis for single crystal growth is provided in a single crystal production system comprising a crucible containing a solvent and provided in a growth furnace through an insulation material and an external heating system for heating the solution and provided around the growth furnace and can be lowered and raised.

11. A seed crystal axis for solution growth of single crystal as set forth in claim 2, wherein the seed crystal support member is a carbon rod.

12. A seed crystal axis for solution growth of single crystal as set forth in claim 3, wherein the seed crystal support member is a carbon rod.

13. A seed crystal axis for solution growth of single crystal as set forth in claim 4, wherein the seed crystal support member is a carbon rod.

14. A seed crystal axis for single crystal growth as set forth in claim 2, wherein the laminated carbon sheet is comprised of adjoining carbon thin films between which a sheet with a mechanical strength larger than the carbon thin films is interposed.

15. A seed crystal axis for solution growth of single crystal as set forth in claim 2, wherein the seed crystal axis for single crystal growth is provided in a single crystal production system comprising a crucible containing a solvent and provided in a growth furnace through an insulation material and an external heating system for heating the solution and provided around the growth furnace and can be lowered and raised.

16. A seed crystal axis for solution growth of single crystal as set forth in claim 3, wherein the seed crystal axis for single crystal growth is provided in a single crystal production system comprising a crucible containing a solvent and provided in a growth furnace through an insulation material and an external heating system for heating the solution and provided around the growth furnace and can be lowered and raised.

17. A seed crystal axis for solution growth of single crystal as set forth in claim 4, wherein the seed crystal axis for single crystal growth is provided in a single crystal production system comprising a crucible containing a solvent and provided in a growth furnace through an insulation material and an external heating system for heating the solution and provided around the growth furnace and can be lowered and raised.

* * * * *